(12) United States Patent
Prushinskiy et al.

(10) Patent No.: US 8,461,058 B2
(45) Date of Patent: Jun. 11, 2013

(54) ORGANIC LAYER DEPOSITION APPARATUS, AND METHOD OF MANUFACTURING ORGANIC LIGHT-EMITTING DISPLAY APPARATUS USING THE SAME

(75) Inventors: Valeriy Prushinskiy, Yongin (KR); Len Kaplan, Yongin (KR); Se-Ho Cheong, Yongin (KR); Won-Sik Hyun, Yongin (KR); Heung-Yeol Na, Yongin (KR); Kyong-Tae Park, Yongin (KR); Byoung-Seong Jeong, Yongin (KR); Yong-Sup Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 104 days.

(21) Appl. No.: 13/244,110

(22) Filed: Sep. 23, 2011

(65) Prior Publication Data

US 2012/0100644 A1   Apr. 26, 2012

(30) Foreign Application Priority Data

Oct. 22, 2010   (KR) .................. 10-2010-0103677

(51) Int. Cl.
*H01L 21/469*   (2006.01)
*H01L 21/31*   (2006.01)
*H01L 21/00*   (2006.01)
*H01L 51/30*   (2006.01)

(52) U.S. Cl.
USPC ............. 438/758; 438/780; 438/778; 438/22; 257/E51.025

(58) Field of Classification Search
USPC ............. 438/758, 780, 778, 22; 257/E51.025
See application file for complete search history.

(56) References Cited

U.S. PATENT DOCUMENTS 6,255,775 B1    7/2001  Ikuko et al.
7,015,154 B2 *  3/2006  Yamazaki et al. ............. 438/795
7,833,354 B2 * 11/2010  Kim et al. ..................... 118/726

(Continued)

FOREIGN PATENT DOCUMENTS

JP  2002-004045        1/2002
JP  2002-175878 A      6/2002
JP  2003-297562       10/2003
JP  2008-196002        8/2008

OTHER PUBLICATIONS

Machine English Translation of JP 2002-004045.
Machine English Translation of JP 2003-297562.

(Continued)

*Primary Examiner* — Luan C Thai
(74) *Attorney, Agent, or Firm* — Christie, Parker & Hale, LLP

(57) ABSTRACT

An organic layer deposition apparatus including an electrostatic chuck combined with a substrate so as to fixedly support the substrate. The organic layer deposition apparatus including a receiving surface that has a set curvature for receiving the substrate; a deposition source for discharging a deposition material toward the substrate; a deposition source nozzle unit disposed at a side of the deposition source and including a plurality of deposition source nozzles arranged in a first direction; and a patterning slit sheet disposed to face the deposition source nozzle unit, and having a plurality of patterning slits arranged in a second direction perpendicular to the first direction, wherein a cross section of the patterning slit sheet on a plane formed by lines extending in the second direction and a third direction is bent by a set degree, wherein the third direction is perpendicular to the first and second directions.

20 Claims, 10 Drawing Sheets

U.S. PATENT DOCUMENTS

2002/0076847 A1    6/2002  Yamada et al.
2003/0140858 A1*   7/2003  Marcus et al. ............... 118/726
2005/0208697 A1*   9/2005  Seo et al. ..................... 438/82
2007/0212896 A1*   9/2007  Olsen et al. .................. 438/758

OTHER PUBLICATIONS

Machine English Translation of JP 2008-196002.

* cited by examiner

ORGANIC LAYER DEPOSITION APPARATUS, AND METHOD OF MANUFACTURING ORGANIC LIGHT-EMITTING DISPLAY APPARATUS USING THE SAME

CROSS-REFERENCE TO RELATED PATENT APPLICATION

This application claims priority to and the benefit of Korean Patent Application No. 10-2010-0103677, filed on Oct. 22, 2010, in the Korean Intellectual Property Office, the entire content of which is incorporated herein by reference.

BACKGROUND

1. Field

Aspects of the present invention relate to an organic layer deposition apparatus and a method of manufacturing an organic light-emitting display device by using the same, and more particularly, to an organic layer deposition apparatus that can be simply applied to the manufacture of large-sized display devices on a mass scale and that can be used for high-definition patterning, and a method of manufacturing an organic light-emitting display device by using the organic layer deposition apparatus.

2. Description of the Related Art

Organic light-emitting display devices have a larger viewing angle, better contrast characteristics, and a faster response rate than other display devices, and thus have drawn attention as a next-generation display device.

An organic light-emitting display device includes intermediate layers, including an emission layer disposed between a first electrode and a second electrode that are arranged opposite to each other. The electrodes and the intermediate layers may be formed by using various methods, one of which is to perform a separate deposition method for each layer. When an organic light-emitting display device is manufactured by using the separate deposition method, a fine metal mask (FMM) having the same pattern as an organic layer to be formed is disposed to closely contact a substrate, and an organic material is deposited over the FMM in order to form the organic layer having the desired pattern.

However, the separate deposition method using such a FMM is not suitable for manufacturing larger devices using a mother glass having a fifth generation (5G) size or greater. In other words, when such a large mask is used, the mask may bend due to self-gravity, thereby distorting a pattern. This is not conducive for the recent trend towards high-definition patterns.

SUMMARY

One or more aspects of the present invention are directed toward an organic layer deposition apparatus that is suitable for manufacturing large-sized display devices on a mass scale and that can be used for high-definition patterning, and a method of manufacturing an organic light-emitting display device by using the organic layer deposition apparatus.

According to an embodiment of the inventive concept, there is provided an organic layer deposition apparatus for forming an organic layer on a substrate, the apparatus including an electrostatic chuck combined with the substrate so as to fixedly support the substrate, and including a receiving surface having a set curvature for receiving the substrate; a deposition source for discharging a deposition material toward the substrate; a deposition source nozzle unit disposed at a side of the deposition source and including a plurality of deposition source nozzles arranged in a first direction; and a patterning slit sheet disposed to face the deposition source nozzle unit, and having a plurality of patterning slits arranged in a second direction perpendicular to the first direction, wherein a cross section of the patterning slit sheet on a plane formed by lines extending in the second direction and a third direction is bent by a set degree, wherein the third direction is perpendicular to the first and second directions. The deposition source, the deposition source nozzle unit, and the patterning slit sheet are separated from the substrate by a set distance so as to perform deposition while the substrate is moved in the first direction with respect to the deposition source, the deposition source nozzle unit, and the patterning slit sheet.

The substrate may be bent to have the same curvature as the electrostatic chuck when the substrate is combined with the receiving surface of the electrostatic chuck.

The patterning slit sheet may be separated from the substrate by a set distance, and may be bent to have substantially the same curvature as the receiving surface of the electrostatic chuck.

The patterning slit sheet may be separated from the substrate by a set distance, and may have a polygonal shape corresponding to a shape of the receiving surface of the electrostatic chuck.

In one embodiment, the apparatus is configured to perform deposition while the electrostatic chuck, combined with the substrate, is moved in the first direction with respect to the deposition source, the deposition source nozzle unit, and the patterning slit sheet.

In one embodiment, the receiving surface is configured to be combined closely with the substrate due an electromagnetic force applied by the electrostatic chuck.

The deposition source, the deposition source nozzle unit, and the patterning slit sheet may be integrated as one body via one or more connection members.

The one or more connection members may guide movement of the deposition material.

The one or more connection members may seal a space between the deposition source nozzle unit disposed at the side of the deposition source and the patterning slit sheet.

The deposition material may be continuously deposited on the substrate while the substrate or the organic layer deposition apparatus is moved relative to the other in the first direction.

The patterning slit sheet of the organic layer deposition apparatus is smaller than the substrate.

A width of the patterning slit sheet may be substantially equal to a width of the substrate, in the second direction.

The plurality of deposition source nozzles may be tilted at a set angle.

The plurality of deposition source nozzles may include deposition source nozzles arranged in two rows in the first direction, and the deposition source nozzles in the two rows may be tilted to face each other.

The plurality of deposition source nozzles may include deposition source nozzles arranged in first and second rows formed in the first direction. The deposition source nozzles of the first row located at a left side of the patterning slit sheet may be arranged to face a right second side of the patterning slit sheet, and the deposition source nozzles of the second row located at the right side of the patterning slit sheet may be arranged to face the left side of the patterning slit sheet.

According to another embodiment of the inventive concept, there is provided a method of manufacturing an organic light-emitting display device by using an organic layer deposition apparatus for forming an organic layer on a substrate, the method including bending the substrate to have a set curvature; disposing the substrate to be separated from the organic layer deposition apparatus by a set distance; and depositing a deposition material, discharged from the organic layer deposition apparatus, onto the substrate while the organic layer deposition apparatus or the substrate is moved relative to the other.

The bending of the substrate may include disposing the substrate on an electrostatic chuck that includes a receiving surface having a set curvature; and applying voltage to the electrostatic chuck so as to closely combine the substrate with the receiving surface.

The organic layer deposition apparatus may include a patterning slit sheet having a plurality of patterning slits and being bent to have substantially the same curvature as the receiving surface of the electrostatic chuck. The deposition material deposited on the substrate may be patterned by the patterning slit sheet.

The organic layer deposition apparatus may include a patterning slit sheet including a plurality of patterning slits and being formed to have a polygonal shape corresponding to a shape of the receiving surface of the electrostatic chuck. The deposition material deposited on the substrate may be patterned by the patterning slit sheet.

According to another embodiment of the inventive concept, there is provided a method of manufacturing an organic light-emitting display device, the method including disposing an organic layer deposition apparatus to be separated from a substrate fixed onto an electrostatic chuck including a receiving surface having a set curvature, wherein the substrate has the same curvature as the receiving surface; and performing deposition on the substrate while the organic layer deposition apparatus or the substrate fixed onto the electrostatic chuck is moved relative to the other. The organic layer deposition apparatus may include a deposition source for discharging a deposition material; a deposition source nozzle unit disposed at a side of the deposition source and including a plurality of deposition source nozzles arranged in a first direction; and a patterning slit sheet disposed to face the deposition source nozzle unit, and having a plurality of patterning slits arranged in a second direction perpendicular to the first direction, wherein a cross section of the patterning slit sheet on a plane formed by lines extending in the second direction and a third direction is bent by a set degree, wherein the third direction is perpendicular to the first and second directions.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
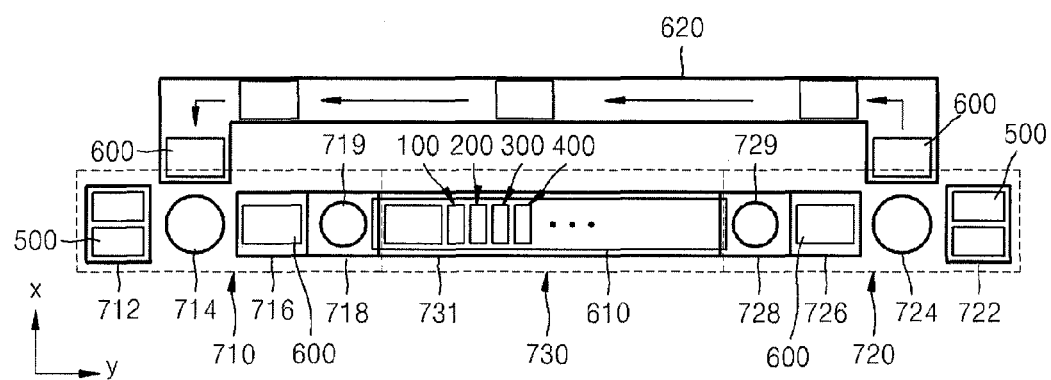
FIG. 1 is a schematic view of an organic layer deposition apparatus according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when a first element is referred to as being "on" a second element, it can be directly on the second element or be indirectly on the second element with one or more intervening elements interposed therebetween. Like reference numerals designate like elements throughout the specification.

FIG. 1 is a schematic view of an organic layer deposition apparatus according to an embodiment of the present invention. Referring to FIG. 1, the organic layer deposition apparatus includes a loading unit 710, a deposition unit 730, an unloading unit 720, a first conveyer unit 610, and a second conveyer unit 620.

The loading unit 710 may include a first rack 712, a transport robot 714, a transport chamber 716, and a first inversion chamber 718.

A plurality of substrates 500 onto which a deposition material is not applied are stacked up on the first rack 712. The transport robot 714 picks up one of the substrates 500 from the first rack 712, disposes it on an electrostatic chuck 600 transferred via the second conveyer unit 620, and moves the electrostatic chuck 600 having the substrate 500 thereon into the transport chamber 716.

The first inversion chamber 718 is disposed adjacent to the transport chamber 716. The first inversion chamber 718 includes a first inversion robot 719 that inverts the electrostatic chuck 600 and then loads it onto the first conveyer unit 610 of the deposition unit 730.

Figure 2:
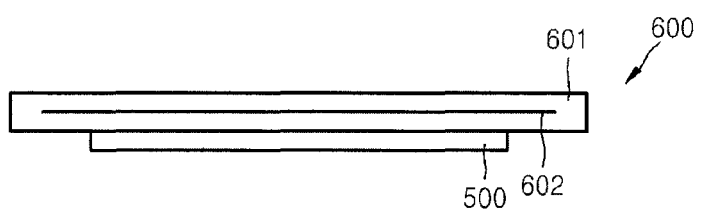
FIG. 2 is a cross-sectional view of an example of an electrostatic chuck of FIG. 1.

Referring to FIG. 2, the electrostatic chuck 600 may include an electrode 602 embedded in a main body 601 of the electrostatic chuck 600. Here, the main body 601 is formed of ceramic, and the electrode 602 is supplied with power. The electrostatic chuck 600 is configured to fix the substrate 500 on a surface of the main body 601 as high voltage is applied to the electrode 602.

Referring back to FIG. 1, the transport robot 714 places the substrate 500 on the electrostatic chuck 600, and the electrostatic chuck 600 having the substrate 500 thereon is moved to the transport chamber 716. The first inversion robot 719 inverts the electrostatic chuck 600 in such a manner that the substrate 500 is turned downward in the deposition unit 730.

The unloading unit 720 is constituted to operate in an opposite manner to the loading unit 710 described above. Specifically, a second inversion robot 729 in a second inversion chamber 728 inverts the electrostatic chuck 600 having the substrate 500 thereon, which has passed through the deposition unit 730 and then moves the electrostatic chuck 600 having the substrate 500 thereon into an ejection chamber 726. Then, an ejection robot 724 removes the electrostatic chuck 600 having the substrate 500 thereon from the ejection chamber 726, separates the substrate 500 from the electrostatic chuck 600, and then loads the substrate 500 into the second rack 722. The electrostatic chuck 600 separated from the substrate 500 is returned back into the loading unit 710 via the second conveyer unit 620.

However, the present invention is not limited to the above description. For example, when the substrate 500 is initially disposed on the electrostatic chuck 600, the substrate 500 may be fixed onto a bottom surface of the electrostatic chuck 600 and then moved into the deposition unit 730. In this case, for example, the first inversion chamber 718 and the first inversion robot 719, and the second inversion chamber 728 and the second inversion robot 729 are not required.

The deposition unit 730 may include at least one deposition chamber. As illustrated in FIG. 1, the deposition unit 730 may include a first chamber 731, in which first to four organic layer deposition assemblies 100, 200, 300, and 400 are disposed. Although FIG. 1 illustrates that a total of four organic layer deposition assemblies, i.e., the first to fourth organic layer deposition assemblies 100 to 400, are installed in the first chamber 731, the total number of organic layer deposition assemblies that may be installed in the first chamber 731 may vary according to a deposition material and deposition conditions. The first chamber 731 is maintained in a vacuum state during a deposition process.

In the embodiment illustrated in FIG. 1, the electrostatic chuck 600 having the substrate 500 thereon may be moved at least to the deposition unit 730 or may be moved sequentially to the loading unit 710, the deposition unit 730, and the unloading unit 720, by the first conveyor unit 610. The electrostatic chuck 600 that is separated from the substrate 500 in the unloading unit 720 is moved back to the loading unit 710 by the second conveyor unit 620.

Figure 3:
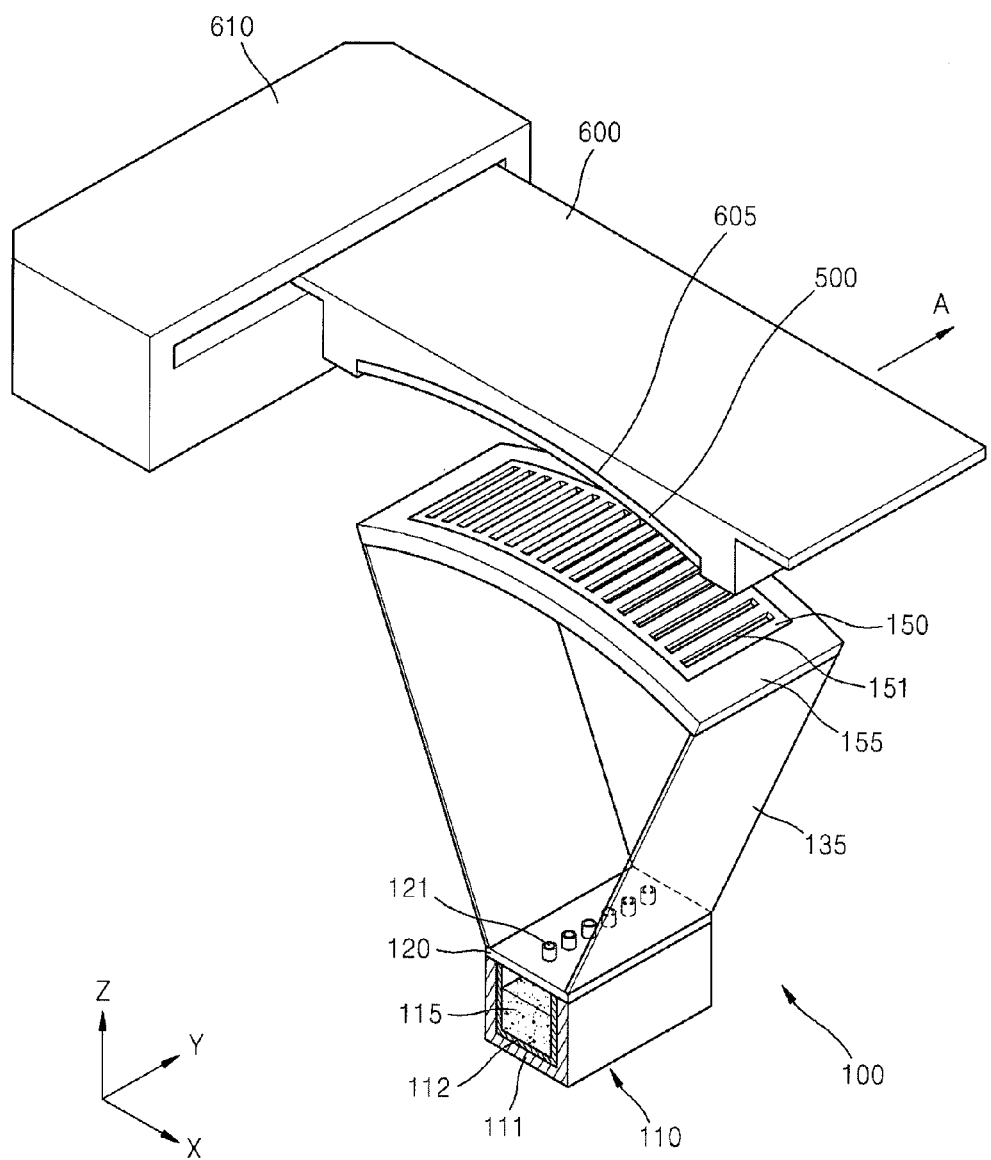
FIG. 3 is a schematic perspective view of an organic layer deposition assembly of the organic layer deposition apparatus of FIG. 1, according to an embodiment of the present invention.
Figure 4:
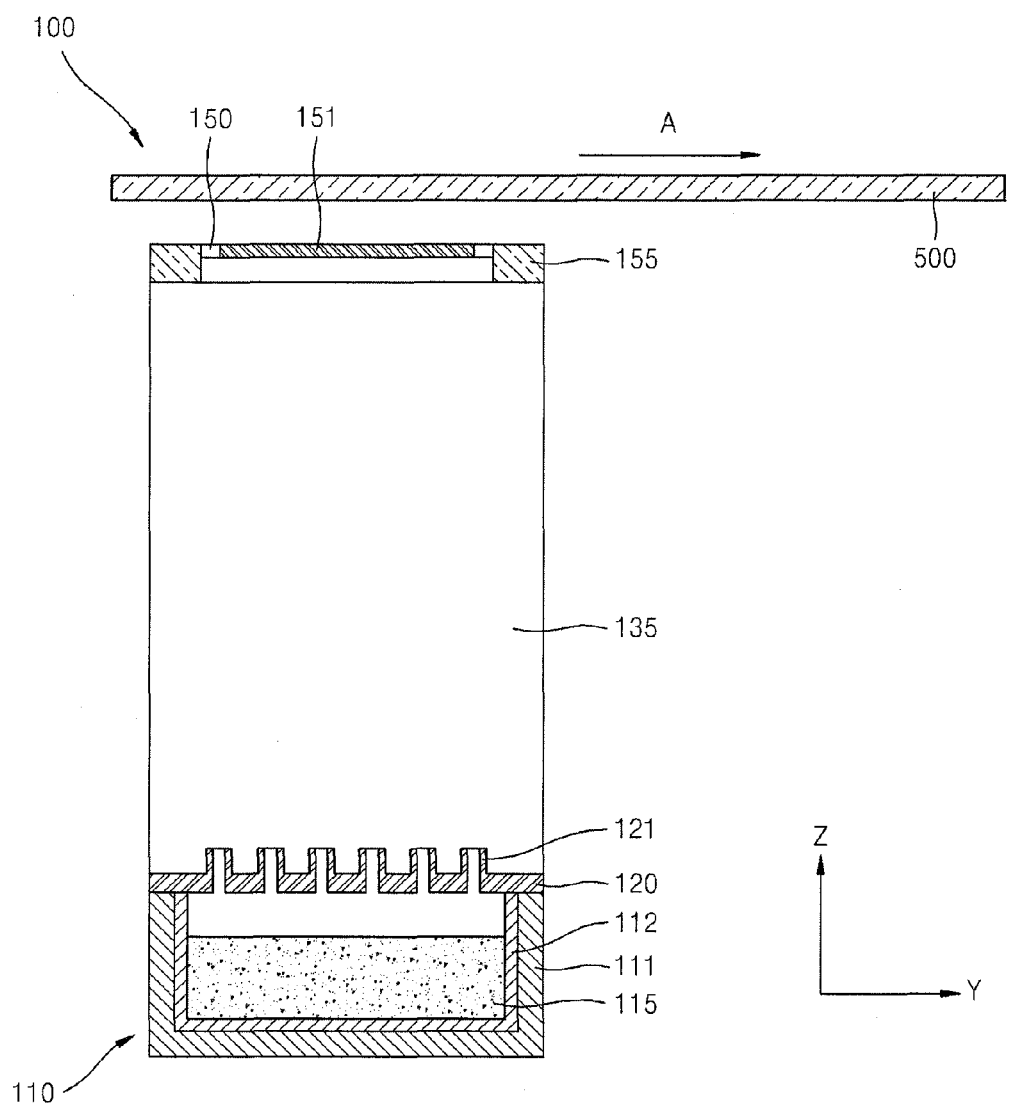
FIG. 4 is a schematic sectional side view of the organic layer deposition assembly of FIG. 3.
Figure 5:
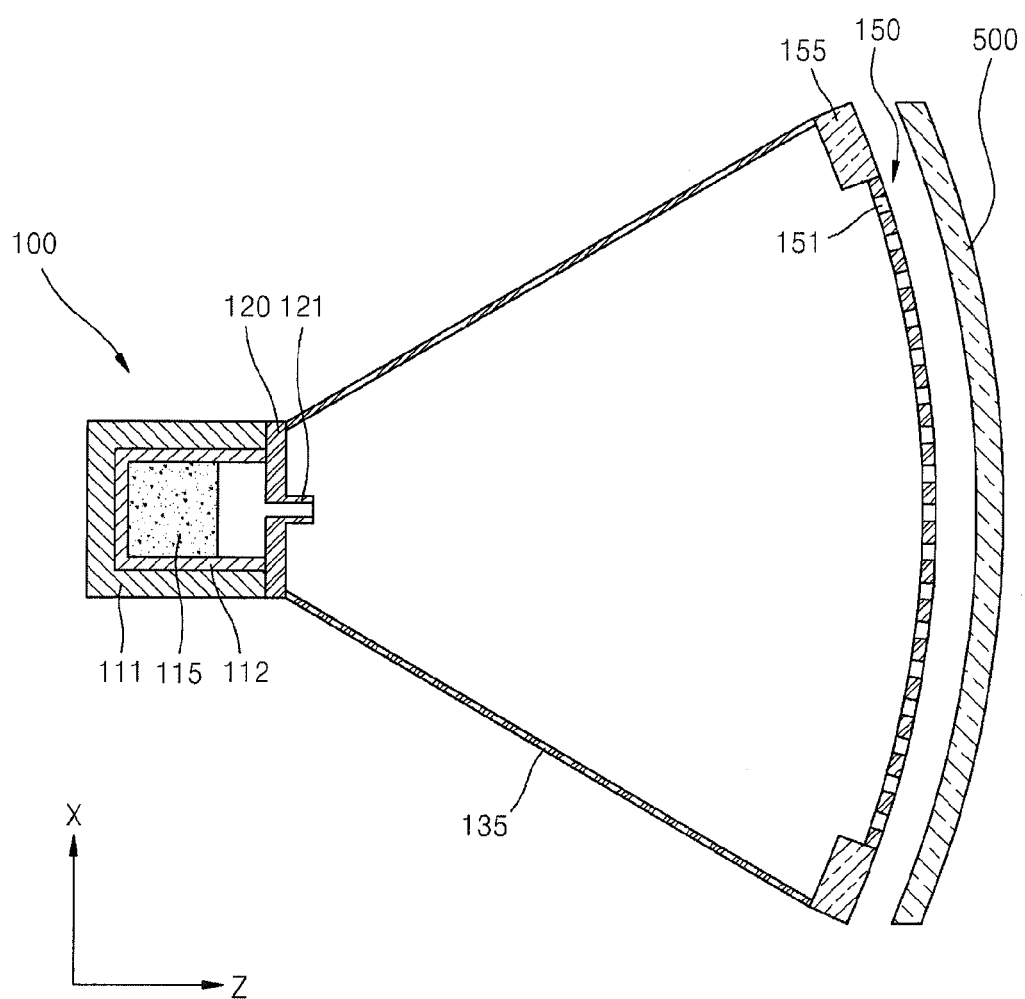
FIG. 5 is a schematic sectional plan view of the organic layer deposition assembly of FIG. 3.

The organic layer deposition assembly 100 of the organic layer deposition apparatus described above in FIG. 1 according to an embodiment of the present invention, will now be described in more detail. FIG. 3 is a schematic perspective view of the organic layer deposition assembly 100 of the organic layer deposition apparatus of FIG. 1, according to an embodiment of the present invention. FIG. 4 is a schematic sectional side view of the organic layer deposition assembly 100 of FIG. 3, according to an embodiment of the present invention. FIG. 5 is a cross-sectional plan view of the organic layer deposition assembly 100 of FIG. 3.

Referring to FIGS. 3, 4 and 5, the organic layer deposition assembly 100 according to the current embodiment includes a deposition source 110, a deposition source nozzle unit 120, and a patterning slit sheet 150.

In one embodiment, all the components of the organic layer deposition assembly 100 may be disposed within a chamber that is maintained at an appropriate degree of vacuum. The chamber is maintained at an appropriate vacuum in order to allow a deposition material to move in a substantially straight line through the organic layer deposition apparatus 100.

The substrate 500 that is a deposition target is disposed in the chamber (see the first chamber 731 of FIG. 1). The substrate 500 may be a substrate for flat panel displays. A large substrate, such as a mother glass, for manufacturing a plurality of flat panel displays, may be used as the substrate 500, but other substrates may also be employed.

The substrate 500 is combined with a receiving surface 605 having a set or predetermined curvature of the electrostatic chuck 600 to closely contact the receiving surface 605. The substrate 500 combined with the electrostatic chuck 600 is moved by the first conveyor unit 610. The combination of the electrostatic chuck 600 and the substrate 500 will be described in detail later.

In the current embodiment, deposition is performed while the substrate 500 or the organic layer deposition assembly 100 is moved relative to the other.

In particular, in the conventional FMM deposition method, the size of a FMM has to be equal to the size of a substrate. Thus, the size of the FMM has to be increased as the substrate becomes larger. However, it is neither straightforward to manufacture a large FMM nor to extend an FMM to be accurately aligned with a pattern.

In order to overcome this problem, in the organic layer deposition assembly 100 according to the current embodiment, deposition may be performed while the organic layer deposition assembly 100 or the substrate 500 is moved relative to the other. In other words, deposition may be continuously performed while the substrate 500 disposed to face the organic layer deposition assembly 100 is moved in a Y-axis direction. That is, deposition may be performed in a scanning manner while the substrate 500 is moved in a direction of arrow A in FIG. 3. Although the substrate 500 is illustrated as being moved in the Y-axis direction in FIG. 3 when deposition is performed, the present invention is not limited thereto. Deposition may be performed while the organic layer deposition assembly 100 is moved in the Y-axis direction, while the substrate 500 is fixed.

Thus, in the organic layer deposition assembly 100 according to the current embodiment, the patterning slit sheet 150 may be significantly smaller than a FMM used in the conventional deposition method. In other words, in the organic layer deposition assembly 100 according to the current embodiment of the present invention, deposition is continuously performed, i.e., in a scanning manner while the substrate 500 is moved in the Y-axis direction. Thus, lengths of the patterning slit sheet 150 in the X-axis and Y-axis directions may be significantly less than the lengths of the substrate 600 in the X-axis and Y-axis directions. As described above, since the patterning slit sheet 150 may be significantly smaller than a FMM used in the conventional deposition method, it is relatively easy to manufacture the patterning slit sheet 150. In other words, using the patterning slit sheet 150, which is smaller than a FMM used in the conventional deposition method, is more convenient in all processes, including etching and other subsequent processes, such as precise extension, welding, moving, and cleaning processes, compared to the conventional deposition method using the larger FMM. This is more advantageous for a relatively large display device.

In order to perform deposition while the organic layer deposition assembly 100 or the substrate 500 is moved relative to the other as described above, the organic layer deposition assembly 100 and the substrate 500 may be separated from each other by a set or predetermined distance. This will be described later in more detail.

The deposition source 110 that contains and heats a deposition material 115 is disposed in an opposite side of the chamber to a side in which the substrate 500 is disposed. While the deposition material 115 contained in the deposition source 110 is vaporized, the deposition material 115 is deposited on the substrate 500.

In particular, the deposition source 110 includes a crucible 111 filled with the deposition material 115, and a heater 112 that heats the crucible 111 to vaporize the deposition material 115 in the crucible 111 so as to move the deposition material 115 towards a side of the crucible 111, and in particular, towards the deposition source nozzle unit 120.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 that may be arranged at equal intervals in the Y-axis direction, i.e., a scanning direction of the substrate 500. The deposition material 110 vaporized in the deposition source 115, passes through the deposition source nozzle unit 120 towards the substrate 500. As described above, when the deposition source nozzle unit 120 includes the plurality of deposition source nozzles 121 arranged in the Y-axis direction, that is, the scanning direction of the substrate 500, the size of a pattern formed of the deposition material discharged through the patterning slits 151 of the patterning slit sheet 150 is affected by the size of one of the deposition source nozzles 121 (since there is only one line of deposition nozzles in the X-axis direction), and thus no shadow zone may be formed on the substrate 500. In addition, since the plurality of deposition source nozzles 121 are arranged in the scanning direction of the substrate 500, even when there is a difference in flux between the deposition source nozzles 121, the difference may be compensated for and deposition uniformity may be maintained constant.

The patterning slit sheet 150 and a frame 155 are disposed between the deposition source 110 and the substrate 500. The frame 155 may be formed in a lattice shape, similar to a window frame. The patterning slit sheet 150 is bound inside the frame 955. The patterning slit sheet 150 includes the plurality of patterning slits 151 arranged in the X-axis direction. The deposition material 115 vaporized in the deposition source 110, passes through the deposition source nozzle unit 120 and the patterning slit sheet 150 towards the substrate 500. The patterning slit sheet 150 may be manufactured by etching, which is the same method as used in a conventional method of manufacturing an FMM, and in particular, a striped FMM. In this regard, the total number of patterning slits 151 may be greater than the total number of deposition source nozzles 121.

In the organic layer deposition assembly 100 according to the current embodiment, the patterning slit sheet 150 and the substrate 500 are formed to have a set or predetermined curvature. This will be described in detail later.

The deposition source 110 and the deposition source nozzle unit 120 coupled to the deposition source 110 may be disposed to be separated from the patterning slit sheet 150 by a set or predetermined distance. Alternatively, the deposition source 110 and the deposition source nozzle unit 120 coupled to the deposition source 110 may be connected to the patterning slit sheet 150 by connection members 135. That is, the deposition source 110, the deposition source nozzle unit 120, and the patterning slit sheet 150 may be integrally formed as one body by being connected to each other via the connection members 135. The connection members 135 may guide the deposition material 121, which is discharged through the deposition source nozzles 121, to move straight, not to flow in the X-axis direction. In FIG. 3, the connection members 135 are formed on only left and right sides of the deposition source 110, the deposition source nozzle unit 120, and the patterning slit sheet 150 so as to guide the deposition material 115 not to flow in the X-axis direction; however, aspects of the present invention are not limited thereto. That is, the connection members 135 may be formed as a sealed box to guide flow of the deposition material 115 both in the X-axis and Y-axis directions.

As described above, the organic layer deposition assembly 100 according to the current embodiment performs deposition while being moved relative to the substrate 500. In order to move the organic layer deposition assembly 100 relative to the substrate 500, the patterning slit sheet 150 is separated from the substrate 500 by a set or predetermined distance.

In a conventional deposition method using a FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the organic layer deposition assembly 100 according to the current embodiment, the patterning slit sheet 150 is disposed to be separated from the substrate 500 that is a deposition target by a set or predetermined distance.

As described above, according to an embodiment of the present invention, a mask is formed to be smaller than a substrate, and deposition is performed while the mask is moved relative to the substrate. Thus, the mask can be easily manufactured. Also, the defects that are caused due to the contact between a substrate and a FMM, which occur in the conventional deposition method, may be reduced or prevented. In addition, since it is unnecessary to contact the substrate with the mask during a deposition process, the manufacturing speed may be improved.

In an organic layer deposition assembly according to an embodiment of the present invention, a patterning slit sheet and a substrate have a set or predetermined curvature.

Figure 6:
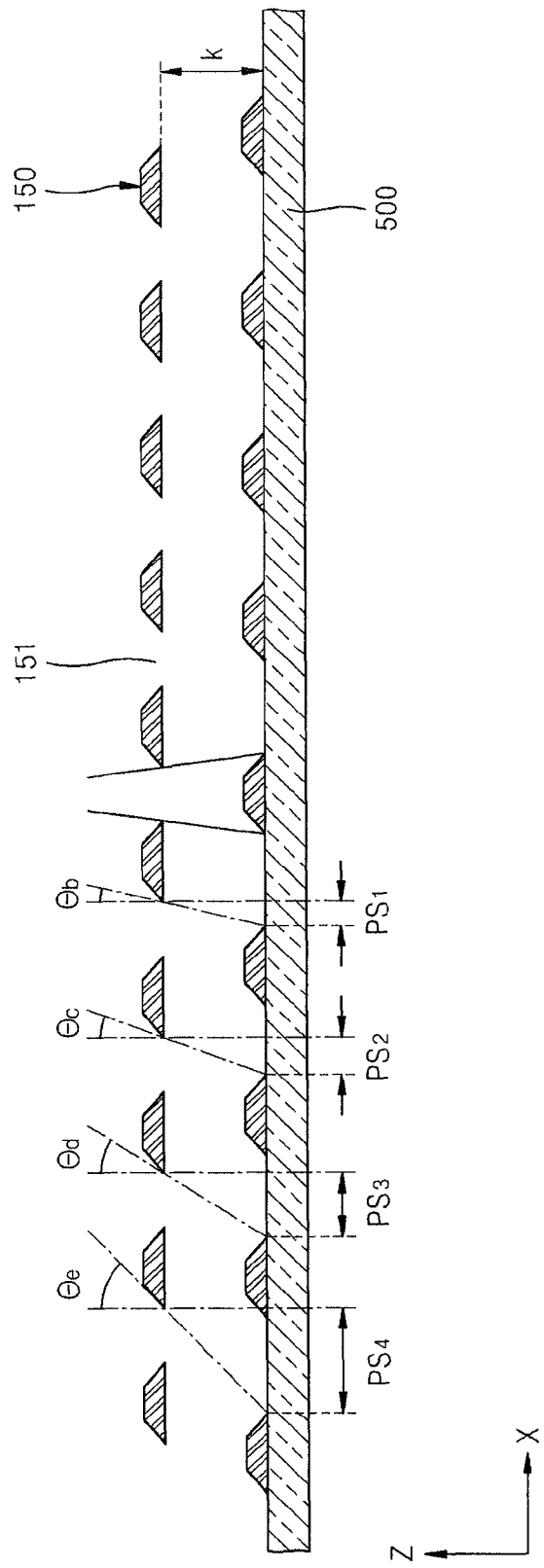
FIG. 6 illustrates an organic layer formed on a substrate when a patterning slit sheet and the substrate are formed to be flat, according to a comparable embodiment.

Specifically, when a patterning slit sheet and a substrate are flat, as is in a comparable embodiment, a pattern deposited on a substrate becomes shifted by a set or predetermined degree toward both ends of the patterning slit sheet in an X-axis direction, as illustrated in FIG. 6.

An incident angle of a deposition material passing through patterning slits formed directly below deposition source nozzles, is almost perpendicular to the substrate. Thus, an organic layer formed of the deposition material passing through patterning slits formed directly below the deposition source nozzles, is formed on an appropriate location. However, a threshold incident angle of the deposition material passing through patterning slits farther from the deposition source nozzles, increases as the distances between the patterning slits and the deposition source nozzles increases. A threshold incident angle of the deposition material passing through patterning slits at the ends of the patterning slit sheet, is about 55°. Accordingly, the deposition material is slantingly incident into the patterning slits farther from the deposition source nozzles, and an organic layer formed of the deposition material is thus formed on locations shifted from the patterning slits by a set or predetermined degree in the X-axis direction.

In this case, the greater the threshold incident angle of the deposition material, the greater degree to which a pattern is shifted. Also, the farther a patterning slit is located from the center of the patterning slit sheet, the greater the threshold incident angle of the deposition material. Thus, the degree to which a pattern is shifted increases as the distance between the center of the patterning slit sheet and a patterning slit increases. That is, referring to FIG. 6, $\theta_b < \theta_c < \theta_d < \theta_e$, and $PS_1 < PS_2 < PS_3 < PS_4$.

To solve this problem, in the organic layer deposition assembly 100 according to the current embodiment, the substrate 500 is bent to have a set or predetermined curvature, the patterning slit sheet 150 is disposed apart from the substrate 500 and adjacent to a side of the substrate 500 by a set or predetermined distance, thereby preventing a pattern from being shifted and a shadow from being formed.

Figure 7:
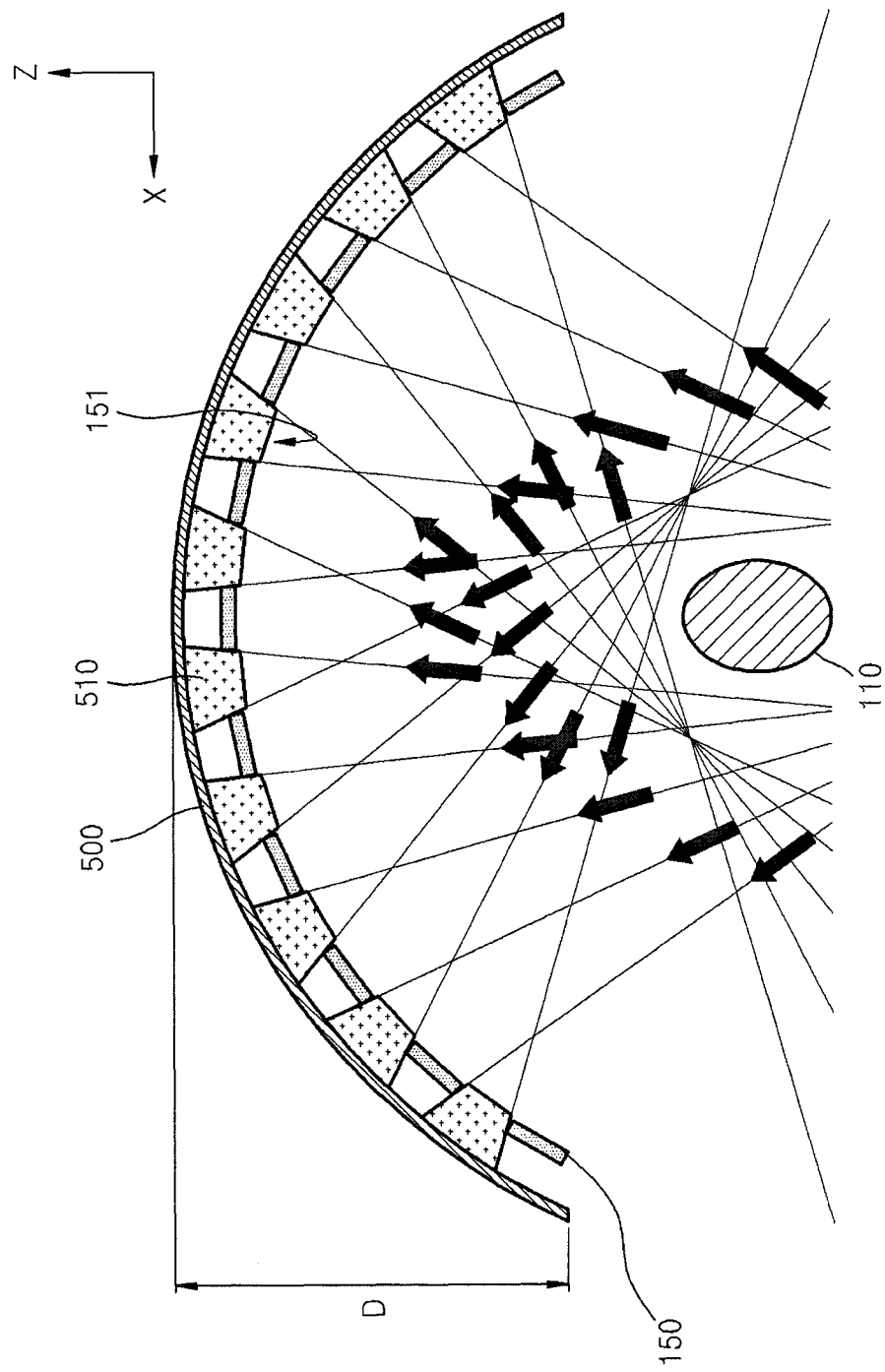
FIG. 7 specifically illustrates a patterning slit sheet and a substrate included in the organic layer deposition assembly of FIG. 3, according to an embodiment of the present invention.

FIG. 7 specifically illustrates the patterning slit sheet 150 and the substrate 500 included in the organic layer deposition assembly of FIG. 3, according to an embodiment of the present invention. Referring to FIGS. 3 and 7, the receiving surface 605 of the electrostatic chuck 600 is bent to have a set or predetermined curvature. The substrate 500 is placed on the receiving surface 605. In general, the substrate 500 is formed of a transparent material, for example, glass or plastic, and may thus be slightly, elastically deformed when set or predetermined pressure is applied thereto. Thus, if high voltage is applied to electrodes on the electrostatic chuck 600 on which the substrate 500 is placed on the receiving surface 605, the substrate 500 is slightly bent in close contact with the receiving surface 605.

The patterning slit sheet 150 disposed apart from the substrate 500 by a set or predetermined distance may have substantially the same curvature as the receiving surface 605 and the substrate 500. If the receiving surface 605 of the electrostatic chuck 600, the substrate 500, and the patterning slit sheet 150 are formed to bend to have the set or predetermined curvature, then the distances between the deposition source 110 and the patterning slits 151 and an incident angle of the deposition material 115 discharged through each of the patterning slits 151 are almost the same for all the patterning slits 151, as illustrated in FIG. 7. Thus, the shapes of and the distances between a plurality of organic layers 510 formed on the substrate 500 are almost the same, thereby preventing a shadow from being formed and a pattern from being shifted.

Here, a degree to which the receiving surface 605, the substrate 500, and the patterning slit sheet 150 are bent, may be equal to the distance D between a highest point of and a lowest point of the substrate 500 in a Z-axis direction. The distance D may be about 1 mm. As described above, the substrate 500 is formed of glass or plastic and may thus be elastically deformed to a set or predetermined degree. If the distance D is about 1 mm, the distance D falls within an elastic deformation range of the substrate 500. Thus, when the substrate 500 is separated from the electrostatic chuck 600, the substrate 500 may be restored back to the original state.

Figure 8:
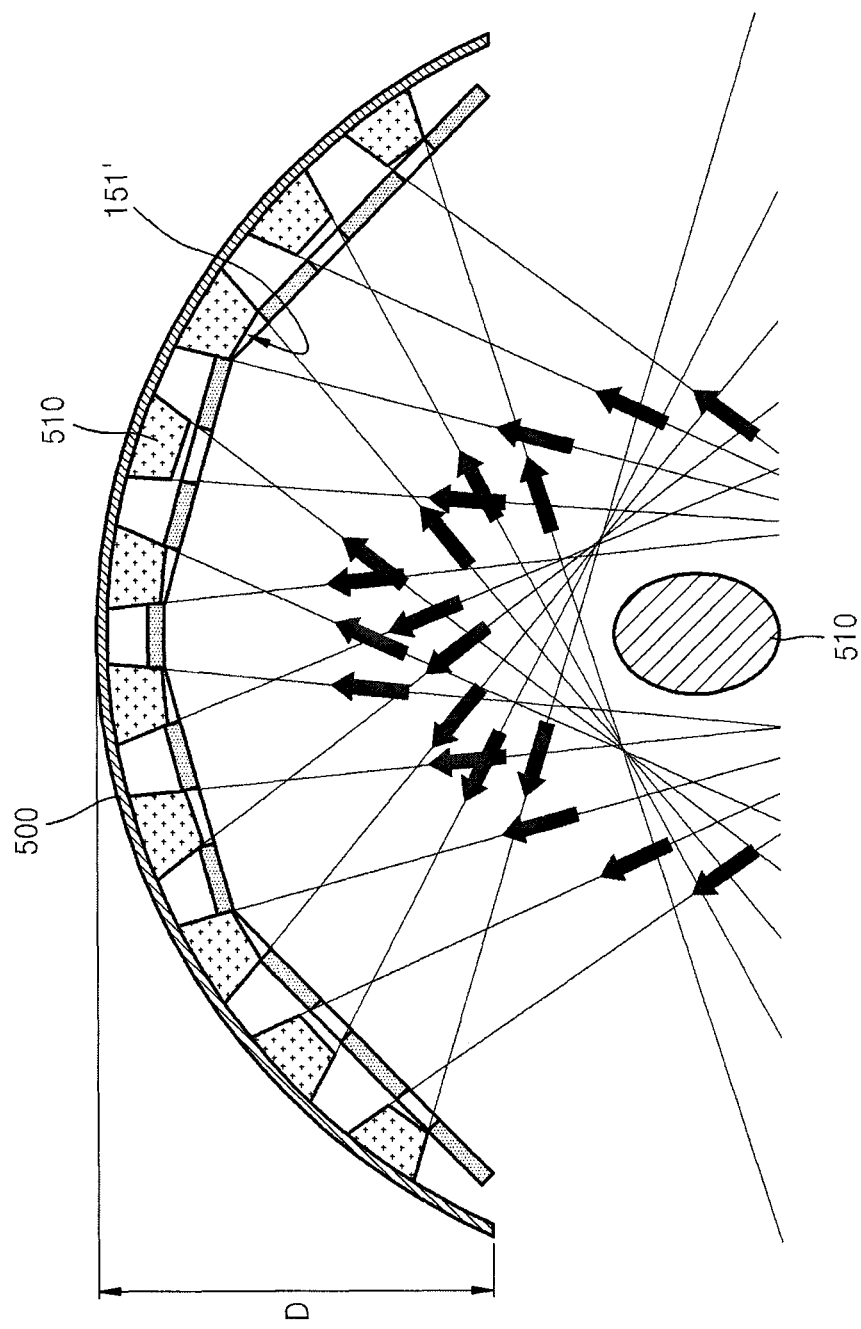
FIG. 8 illustrates a patterning slit sheet differing from the patterning slit sheet of FIG. 7, according to another embodiment of the present invention.

FIG. 8 illustrates a patterning slit sheet 150' that is another embodiment of the pattering slit sheet 150 of FIG. 7, according to the present invention. Referring to FIG. 8, the patterning slit sheet 150' has a polygonal shape, in which the patterning slit sheet 150' is bent a plurality of times. Since the patterning slit sheet 150' is manufactured by extending a metal sheet by a set or predetermined extent, it is not likely to have a smoothly curved surface illustrated in FIG. 7. Thus, it is possible to easily manufacture the patterning slit sheet 150' having a polygonal shape rather than having a predetermined curvature.

Figure 9:
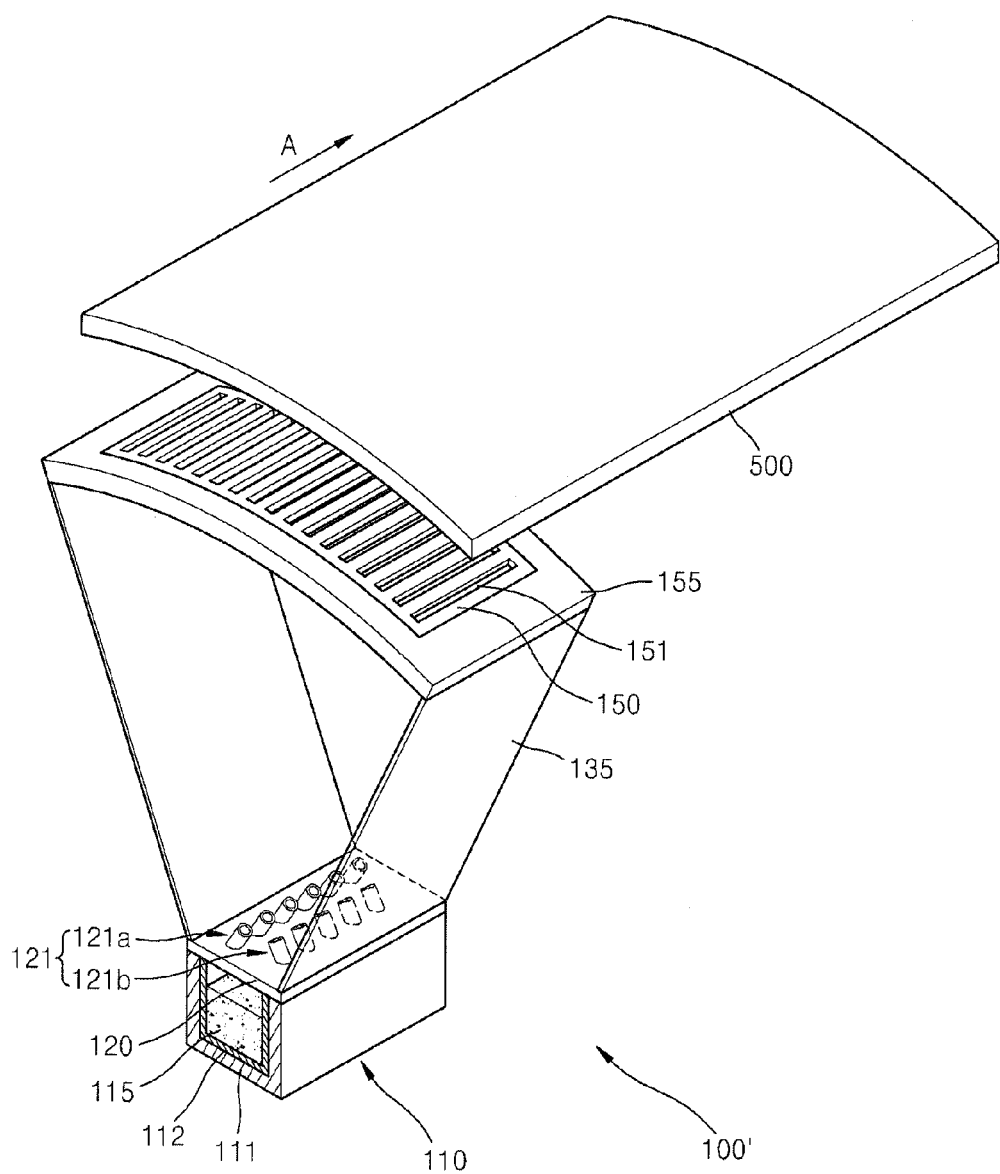
FIG. 9 is a schematic perspective view of an organic layer deposition assembly according to another embodiment of the present invention.

FIG. 9 is a schematic perspective view of an organic layer deposition assembly 100' according to another embodiment of the present invention. Referring to FIG. 9, the organic layer deposition assembly 100' includes a deposition source 100, a deposition source nozzle unit 120, and a patterning slit sheet 150. The deposition source 110 includes a crucible 111 filled with a deposition material 115, and a heater 112 that heats the crucible 111 to vaporize the deposition material 115 contained in the crucible 111 so as to move the vaporized deposition material 115 to the deposition source nozzle unit 120. The deposition source nozzle unit 120 is disposed at a side of the deposition source 110. The deposition source nozzle unit 120 includes a plurality of deposition source nozzles 121 arranged in the Y-axis direction. The patterning slit sheet 150 and a frame 155 are further disposed between the deposition source 110 and a substrate 500. The patterning slit sheet 150 includes a plurality of patterning slits 151 arranged in the X-axis direction. The deposition source 110 and the deposition source nozzle unit 120 may be connected to the patterning slit sheet 150 by connection members 135. The patterning slit sheet 150 and the substrate 500 have a set or predetermined curvature.

In the current embodiment, the plurality of deposition source nozzles 121 formed in the deposition source nozzle unit 120 are tilted at a set or predetermined angle, unlike the previous embodiment described above. In particular, the deposition source nozzles 121 may include deposition source nozzles 121a and 121b arranged in respective rows. The deposition source nozzles 121a and 121b may be arranged in respective rows to alternate in a zigzag pattern. The deposition source nozzles 121a and 121b may be tilted by a set or predetermined angle with respect to an XZ plane.

In the current embodiment, the deposition source nozzles 121a and 121b are arranged to tilt by a set or predetermined angle to each other. The deposition source nozzles 121a of a first row and the deposition source nozzles 121b of a second row may tilt to face each other. That is, the deposition source nozzles 121a of the first row located at a left side of the deposition source nozzle unit 121 may tilt to face a right side of the patterning slit sheet 150, and the deposition source nozzles 121b of the second row located at the right side of the deposition source nozzle unit 121 may tilt to face the left side portion of the patterning slit sheet 150.

Figure 10:
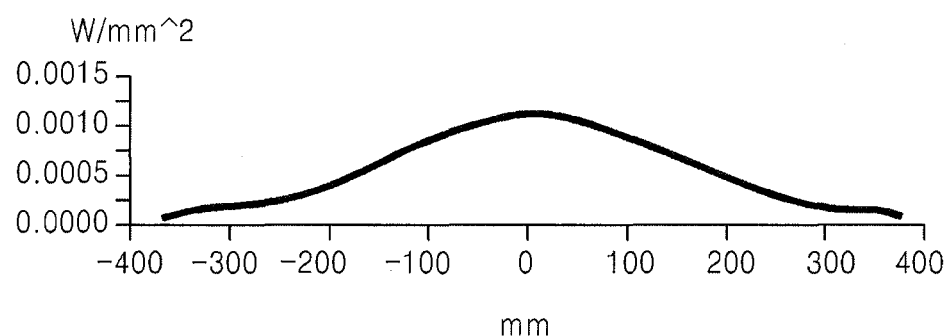
FIG. 10 is a graph schematically showing a distribution pattern of a deposition film formed on a substrate when deposition source nozzles are not tilted in the organic layer deposition assembly of FIG. 9.
Figure 11:
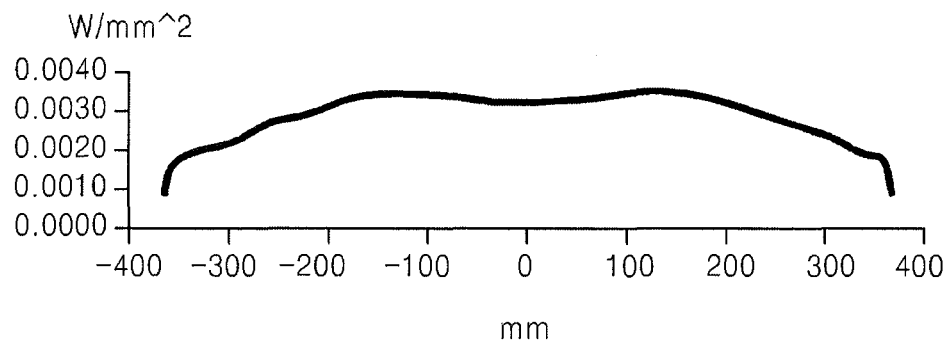
FIG. 11 is a graph schematically showing a distribution pattern of a deposition film formed on the substrate when the deposition source nozzles are tilted in the organic layer deposition assembly of FIG. 9.

FIG. 10 is a graph schematically showing a distribution pattern of a deposition film formed on the substrate 500 when the deposition source nozzles 121 are not tilted in the organic layer deposition assembly of FIG. 9. FIG. 11 is a graph schematically showing a distribution pattern of a deposition film formed on the substrate 500 when the deposition source nozzles 121 are tilted in the organic layer deposition assembly of FIG. 9. Comparing the graphs of FIGS. 10 and 11 with each other, thickness of the deposition film formed on opposite end portions of the substrate 500 when the deposition source nozzles 121 are tilted, is greater than when the deposition source nozzles 121 are not tilted, and thus, the uniformity of the deposition film is improved.

When the deposition source nozzles 121 are tilted, the deposition of the deposition film may be adjusted to lessen a thickness variation between the center and the end portions of the substrate 500 and improve thickness uniformity of the deposition film. Moreover, utilization efficiency of a deposition material may also be improved.

Figure 12:
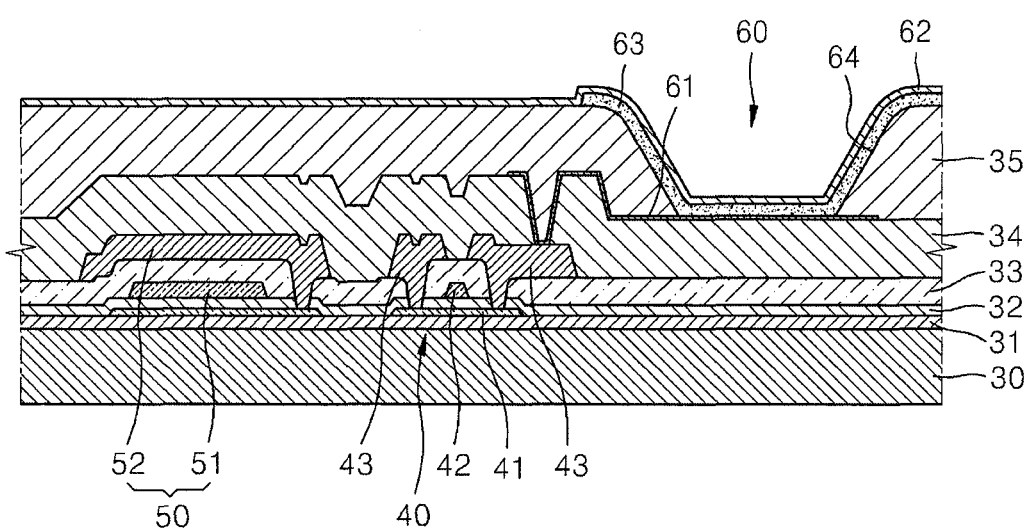
FIG. 12 is a cross-sectional view of an active matrix organic light-emitting display device fabricated by using an organic layer deposition apparatus, according to an embodiment of the present invention.

FIG. 12 is a cross-sectional view of an active matrix organic light-emitting display device fabricated by using an organic layer deposition apparatus, according to an embodiment of the present invention. Referring to FIG. 12, the active matrix organic light-emitting display device is formed on a substrate 30. The substrate 30 may be formed of a transparent material, for example, glass, plastic, or metal. An insulating layer 31, such as a buffer layer, is formed on an entire surface of the substrate 30.

A thin film transistor (TFT) 40, a capacitor 50 that includes first and second capacitor layers 51 and 52, and an organic light-emitting diode (OLED) are disposed on the insulating layer 31.

A semiconductor active layer 41 is formed on the insulating layer 31 in a set or predetermined pattern. A gate insulating layer 32 is formed to cover the semiconductor active layer 41. The semiconductor active layer 41 may include a p-type or n-type semiconductor material.

A gate electrode 42 of the TFT 40 is formed on a region of the gate insulating layer 32 corresponding to the semiconductor active layer 41. An interlayer insulating layer 33 is formed to cover the gate electrode 42. The interlayer insulating layer 33 and the gate insulating layer 32 are etched by, for example, dry etching, to form a contact hole for partially exposing the semiconductor active layer 41.

A source/drain electrode 43 is formed on the interlayer insulating layer 33 to contact the semiconductor active layer 41 through the contact hole. An aestivation layer 34 is formed on the source/drain electrode 43. In one embodiment, a passivation insulating layer may be further formed on the aestivation layer 34 so as to planarize the aestivation layer 34.

The OLED 60 displays predetermined image information by emitting red, green, or blue light as current flows. The OLED 60 includes a first electrode 61 disposed on the aestivation layer 34. The first electrode 61 is electrically connected to the drain electrode 43 of the TFT 40.

A pixel defining layer 35 is formed to cover the first electrode 61. An opening 64 is formed in the pixel defining layer 35, and then an organic layer 63, including an emission layer, is formed in a region defined by the opening 64. A second electrode 62 is formed on the organic layer 63.

The pixel defining layer 35, which defines individual pixels, is formed of an organic material. The pixel defining layer 35 also planarizes the surface of a region of the substrate 30 in which the first electrode 61 is formed, and in particular, the surface of the aestivation layer 34.

The first electrode 61 and the second electrode 62 are insulated from each other, and respectively apply voltages of opposite polarities to the organic layer 63, including an emission layer, to induce light emission.

The organic layer 63 including the emission layer may be formed of a low or high molecular weight organic material. When the organic layer 63 is a low molecular weight organic layer, the organic layer 63 may be formed to have a single- or multi-layered stack structure including at least one layer selected from the group consisting of a hole injection layer (HIL), a hole transport layer (HTL), an emission layer (EML), an electron transport layer (ETL), and an electron injection layer (EIL).

After the organic layer 63 is formed, the second electrode 62 may be formed by substantially the same deposition method as used to form the organic layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode layer 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 functions as a cathode. To this end, such a transparent electrode may be formed by depositing a metal that has a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 63 and forming an auxiliary electrode layer or a bus electrode line thereon from ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a compound thereof on the entire surface of the organic layer 63. The second electrode 62 may be formed by using the same deposition method as used to form the organic layer 63 described above.

The organic layer deposition apparatuses according to the embodiments of the present invention described above may be applied to form an organic layer or an inorganic layer of an organic TFT, and to form layers from various materials.

In view of the foregoing, embodiments of the present invention provide an organic layer deposition apparatus that can be simply applied to the manufacture of large-sized display devices on a mass scale and that can be used for high-definition patterning, and a method of manufacturing an organic light-emitting display device by using the organic layer deposition apparatus. The organic layer deposition apparatus includes an electrostatic chuck combined with the substrate so as to fixedly support the substrate, and including a receiving surface having a set curvature for receiving the substrate; a deposition source for discharging a deposition material toward the substrate; a deposition source nozzle unit disposed at a side of the deposition source and including a plurality of deposition source nozzles arranged in a first direction; and a patterning slit sheet disposed to face the deposition source nozzle unit, and having a plurality of patterning slits arranged in a second direction perpendicular to the first direction, wherein a cross section of the patterning slit sheet on a plane formed by lines extending in the second direction and a third direction is bent by a set degree, wherein the third direction is perpendicular to the first and second directions. Here, the deposition source, the deposition source nozzle unit, and the patterning slit sheet are separated from the substrate by a set distance so as to perform deposition while the substrate is moved in the first direction with respect to the deposition source, the deposition source nozzle unit, and the patterning slit sheet.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic layer deposition apparatus for forming an organic layer on a substrate, the apparatus comprising:
    an electrostatic chuck combined with the substrate so as to fixedly support the substrate, and comprising a receiving surface having a set curvature for receiving the substrate;
    a deposition source for discharging a deposition material toward the substrate;
    a deposition source nozzle unit disposed at a side of the deposition source and comprising a plurality of deposition source nozzles arranged in a first direction; and
    a patterning slit sheet disposed to face the deposition source nozzle unit, and having a plurality of patterning slits arranged in a second direction perpendicular to the first direction, wherein a cross section of the patterning slit sheet on a plane formed by lines extending in the second direction and a third direction is bent by a set degree, wherein the third direction is perpendicular to the first and second directions,
    wherein the deposition source, the deposition source nozzle unit, and the patterning slit sheet are separated from the substrate by a set distance so as to perform deposition while the substrate is moved in the first direction with respect to the deposition source, the deposition source nozzle unit, and the patterning slit sheet.

2. The apparatus of claim 1, wherein the substrate is bent to have the same curvature as the electrostatic chuck when the substrate is combined with the receiving surface of the electrostatic chuck.

3. The apparatus of claim 1, wherein the patterning slit sheet is separated from the substrate by a set distance, and is bent to have substantially the same curvature as the receiving surface of the electrostatic chuck.

4. The apparatus of claim 1, wherein the patterning slit sheet is separated from the substrate by the set distance, and has a polygonal shape corresponding to a shape of the receiving surface of the electrostatic chuck.

5. The apparatus of claim 1, wherein the apparatus is configured to perform deposition while the electrostatic chuck, combined with the substrate, is moved in the first direction with respect to the deposition source, the deposition source nozzle unit, and the patterning slit sheet.

6. The apparatus of claim 1, wherein the receiving surface is configured to be combined closely with the substrate due an electromagnetic force applied by the electrostatic chuck.

7. The apparatus of claim 1, wherein the deposition source, the deposition source nozzle unit, and the patterning slit sheet are integrated as one body via connection members.

8. The apparatus of claim 7, wherein the connecting members are configured to guide movement of the deposition material.

9. The apparatus of claim 7, wherein the connection members are configured to seal a space between the deposition source nozzle unit disposed at the side of the deposition source and the patterning slit sheet.

10. The apparatus of claim 1, wherein the apparatus is configured to continuously deposit the deposition material on the substrate while the substrate is moved with respect to the organic layer deposition apparatus in the first direction.

11. The apparatus of claim 1, wherein the patterning slit sheet is smaller than the substrate.

12. The apparatus of claim 11, wherein a width of the patterning slit sheet is substantially equal to a width of the substrate, in the second direction.

13. The apparatus of claim 1, wherein the plurality of deposition source nozzles are tilted at a set angle.

14. The apparatus of claim 13, wherein the plurality of deposition source nozzles comprise deposition source nozzles arranged in two rows formed in the first direction, and the deposition source nozzles in the two rows are tilted to face each other.

15. The apparatus of claim 13, wherein the plurality of deposition source nozzles comprise deposition source nozzles arranged in first and second rows formed in the first direction,
    wherein the deposition source nozzles of the first row located to overlap a left side of the patterning slit sheet are arranged to face a right side of the patterning slit sheet, and
    the deposition source nozzles of the second row located to overlap the right side of the patterning slit sheet are arranged to face the left side of the patterning slit sheet.

16. A method of manufacturing an organic light-emitting display device by using an organic layer deposition apparatus for forming an organic layer on a substrate, the method comprising:
    bending the substrate to have a set curvature;
    disposing the substrate to be separated from the organic layer deposition apparatus by a set distance; and
    depositing a deposition material discharged from the organic layer deposition apparatus onto the substrate while the organic layer deposition apparatus or the substrate is moved relative to the other.

17. The method of claim 16, wherein the bending of the substrate comprises:
    disposing the substrate on a electrostatic chuck that includes a receiving surface having a set curvature; and
    applying voltage to the electrostatic chuck so as to closely combine the substrate with the receiving surface.

18. The method of claim 16, wherein the organic layer deposition apparatus comprises a patterning slit sheet having a plurality of patterning slits and being bent to have substantially the same curvature as the receiving surface of the electrostatic chuck, and
    the deposition material deposited on the substrate is patterned by the patterning slit sheet.

19. The method of claim 16, wherein the organic layer deposition apparatus comprises a patterning slit sheet including a plurality of patterning slits and being formed to have a polygonal shape corresponding to a shape of the receiving surface of the electrostatic chuck, and
    the deposition material deposited on the substrate is patterned by the patterning slit sheet.

20. A method of manufacturing an organic light-emitting display device, the method comprising:
    disposing an organic layer deposition apparatus to be separated from a substrate fixed onto an electrostatic chuck including a receiving surface having a set curvature, wherein the substrate has the same curvature as the receiving surface; and
    performing deposition on the substrate while the organic layer deposition apparatus or the substrate fixed onto the electrostatic chuck is moved relative to the other,
    wherein the organic layer deposition apparatus comprises:
    a deposition source for discharging a deposition material;
    a deposition source nozzle unit disposed at a side of the deposition source and comprising a plurality of deposition source nozzles arranged in a first direction; and
    a patterning slit sheet disposed to face the deposition source nozzle unit, and having a plurality of patterning slits arranged in a second direction perpendicular to the first direction, wherein a cross section of the patterning slit sheet on a plane formed by lines extending in the second direction and a third direction is bent by a set degree, wherein the third direction is perpendicular to the first and second directions.

* * * * *